United States Patent
Nakayama

(10) Patent No.: US 6,472,608 B2
(45) Date of Patent: Oct. 29, 2002

(54) SEMICONDUCTOR DEVICE

(75) Inventor: Sadao Nakayama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/780,819

(22) Filed: Feb. 9, 2001

(65) Prior Publication Data
US 2001/0015285 A1 Aug. 23, 2001

(30) Foreign Application Priority Data
Feb. 18, 2000 (JP) .................................. 2000-040576

(51) Int. Cl.$^7$ ................................................ H05K 1/03
(52) U.S. Cl. ........................ 174/255; 361/768; 257/738; 257/780
(58) Field of Search ..................... 174/260; 361/767, 361/768, 771; 257/737, 738, 780, 777, 778, 723, 724

(56) References Cited

U.S. PATENT DOCUMENTS

| | | | | | |
|---|---|---|---|---|---|
| 5,519,580 | A | * | 5/1996 | Natarajan et al. | 361/760 |
| 6,018,462 | A | * | 1/2000 | Sakuyama | 361/777 |
| 6,028,366 | A | * | 2/2000 | Abe | 257/779 |
| 6,225,573 | B1 | * | 5/2001 | Nakamura | 174/267 |
| 6,246,587 | B1 | * | 6/2001 | Chen | 361/773 |
| 6,329,605 | B1 | * | 12/2001 | Beroz et al. | 174/256 |

* cited by examiner

Primary Examiner—Kamand Cuneo
Assistant Examiner—Jose H Alcala

(57) ABSTRACT

The present invention provides a semiconductor device of the BGA configuration comprising: a wiring layer 2 arranged on a circuit substrate 1 via an insulation layer; a land metal portion 2 formed on the wiring layer 2; a solder resist 4 layered so as to cover the land metal excluding a center portion thereof and the entire surface of the circuit substrate 1; and a solder ball 5 arranged on the land metal portion defined and surrounded by the solder resist 4; wherein the land metal portion 3 has a solder ball contact surface having a groove (or a line-shaped protrusion) 7 extending continuously.

6 Claims, 5 Drawing Sheets

SEMICONDUCTOR DEVICE

BACKGROUND OF THE INVENTION

1. Field of the Invention

The present invention relates to a semiconductor device and in particular, to a semiconductor device of BGA (ball grid array) configuration having a semiconductor ball as a semiconductor element I/O terminal.

2. Description of the Related Art

Conventional examples are shown in FIG. 5(A) and FIG. 5(B). The conventional examples shown here show a part of the BGA configuration of a semiconductor device using a BGA package.

The conventional example shown in FIG. 5(A) includes a solder ball 803 mounted on a land metal 802 arranged at a predetermined position on a package substrate (circuit substrate) 801. An IC including a semiconductor element is also arranged on the package substrate 801. The land metal 802 is arranged on the package substrate 801 as a signal I/O circuit with outside for the semiconductor element.

In this case, the solder ball 803, as shown in FIG. 5(A), is surrounded by a solder resist 805 and fixed to the land metal 802. The solder ball 803 is fixed to the land metal 802 by heat or conductive adhesive.

However, in this method, the solder ball 803 is attached to the land metal 802 through a surface contact, which does not provide a sufficient mechanical strength. In a fall test, a partial peel off may occur at a boundary 802a between the solder ball 803 and the land metal 802. Thus, it is difficult to realize a sufficient mounting strength.

In order to improve this situation, a technique as shown in FIG. 5(B) has been developed. That is, a solder ball 903 is mounted in such a manner that a land metal 902 protrudes into the solder ball 903. Here, a reference symbol 901 denotes a package substrate and a reference symbol 905 denotes a solder resist.

Moreover, Japanese Patent Publication 10-154766 [1] discloses another technique for increasing the bonding strength between the solder ball and the land metal. That is, a mechanical indentation is formed on the land metal so that the solder ball is attached into this indentation. This technique increases the contact area between the solder ball and the land metal, thereby increasing the bondage strength.

Furthermore, Japanese Patent Publication 8-274211 [2] discloses a technique in which an indentation is arranged at the center portion of the land metal and a mechanical groove is arranged on the land metal to communicate with the indentation, so that a contact surface of the solder ball in a deformed state is fixed into this indentation.

However, in the improved conventional example shown in FIG. 5(B), although the mechanical strength between the solder ball 903 and the land metal 902 is increased, the contact area between the land metal 902 and the package substrate 901 is decreased and the configuration does not allow the solder resist 905 to fix the land metal 902. Accordingly, no strength improvement can be observed in the fall test.

On the other hand, the boundary 902a between the land metal 902 and the package substrate 905 has a small contact area, easily causing a peel-off. Thus, the conventional example shown in FIG. 5(B) cannot realize a sufficient mounting strength.

Moreover, in the technique disclosed in Document [1] in which the solder ball is attached to a mechanical indentation, when attaching the solder ball air and excessive flux are easily contained in the indentation which is simply formed on the land metal. Air bubbles (voids) are generated on the bonding surface between the solder ball and the land metal, which lowers the bonding strength.

Furthermore, in the technique disclosed in Document [2], a mechanical indentation is formed together with a mechanical groove to communicate with the indentation on the land metal so that the solder ball is attached into the indentation. Since the solder ball is attached to the land metal in such a state that the contact surface of the solder ball is melted by heat, the melted contact surface may cover the groove at a timing slightly preceding attachment of the solder ball. This results in that air bubbles (voids) in the indentation remains at the contact surface with the solder ball or in the solder ball, which significantly weakens the solder ball strength at that portion and deteriorates the durability.

SUMMARY OF THE INVENTION

It is therefore an object of the present invention to provide a semiconductor device of the BGA configuration capable of maintaining a sufficient bondage strength between the land metal and the package substrate while increasing the mounting strength of the solder ball on the land metal, thereby realizing a sufficient durability.

In order to achieve the aforementioned object, the present invention provides a semiconductor device of the BGA configuration comprising: a circuit substrate; a wiring layer arrange on the circuit substrate via an insulation layer; a land metal portion formed on a part of the wiring layer; a solder resist layered so as to cover the land metal excluding a center portion thereof and the entire surface of the circuit substrate; and a solder ball arranged at the center portion of the land metal portion defined and surrounded by the solder resist;

wherein the land metal portion has a solder ball contact surface having a groove extending for continuous communication.

Accordingly, when mounting a solder ball 5, firstly a part of the solder ball 5 is pushed into the center portion of the groove formed on the land metal portion. Then, a part surrounding that part of the solder ball 5 is successively pushed into the groove. This increases the contact area between the solder ball and the land metal portion. This reduces the electric resistance when transmitting/receiving a signal, thereby reducing the signal attenuation.

Moreover, even when the solder ball is subjected to an external irregular pressing force in the lateral direction, the solder ball partially protruding into the groove has a strong mechanical strength can stand such a force. Thus, the bondage strength is increased and the mounting strength is significantly reinforced.

Here, the groove on the land metal portion may pass through the center portion of the solder ball contact surface. Moreover, the groove is preferably realized by two line-shaped grooves. In this case, the line-shaped grooves may intersect each other at the center portions thereof.

In this case, the contact area between the solder ball and the land metal portion is increased according to the state of the groove, increasing the solder ball mounting strength.

Furthermore, an air exhaust groove may be arranged for each end of the groove in a solder resist portion covering the ends of the groove so that each end of the groove communicates with the external atmosphere. In this case, the air exhaust groove may communicate each end of the groove directly with the external atmosphere without spreading around the groove.

This facilitates exhaust of remaining flux as an adhesive and remaining air as a result after the solder ball is mounted. That is, even if air and the like are enclosed in the groove by the solder ball, the air is pushed out through the groove into the air exhaust groove and then outside.

According to another aspect of the present invention, there is provided a semiconductor device of the BGA configuration comprising: a circuit substrate; a wiring layer arrange on the circuit substrate via an insulation layer; a land metal portion formed on a part of the wiring layer; a solder resist layered so as to cover the land metal excluding a center portion thereof and the entire surface of the circuit substrate; and a solder ball arranged at the center portion of the land metal portion defined and surrounded by the solder resist;

wherein the land metal portion has a solder ball contact surface having a line-shaped protrusion extending continuously.

This also enables to obtain a semiconductor device having an increased mounting strength functioning almost in the same way as the case when the aforementioned groove is arranged.

Here, the line-shaped protrusion may pass through the center portion of the solder ball contact surface. Moreover, the line-shaped protrusion preferably consists of at least two line-shaped protrusions. Furthermore, the two line-shaped protrusions may intersect each other at the center portion thereof.

In this case also, the contact area between the solder ball and the land metal portion is increased according to the state of the line-shaped protrusion(s), thereby increasing the solder ball mounting strength.

Furthermore, a predetermined air exhaust groove may. be provided at a side wall of the solder resist covering the circumference of the land metal so that a circumferential portion of the solder resist can communicates with the external atmosphere.

This facilitates exhaust of remaining flux as an adhesive and remaining air after the solder ball is mounted. That is, even when remaining air and the like are enclosed over the land metal portion by the solder ball, the remaining air and the like are pushed from the end portion of the land metal portion into the air exhaust groove and then outside.

BRIEF DESCRIPTION OF THE DRAWINGS

FIG. 1 shows a first embodiment of the present invention.

FIG. 2 shows a modified example of FIG. 1.

FIG. 3 shows another modified example of FIG. 1.

FIG. 4(A) is a cross sectional view of a land metal portion and a solder ball; and FIG. 4(B) is a plan view of FIG. 4(A) excluding the solder ball.

FIG. 5 shows conventional examples.

DESCRIPTION OF THE PREFERRED EMBODIMENTS

Description will now be directed to preferred embodiments of the present invention with reference to the attached drawings.

Figure 1A:
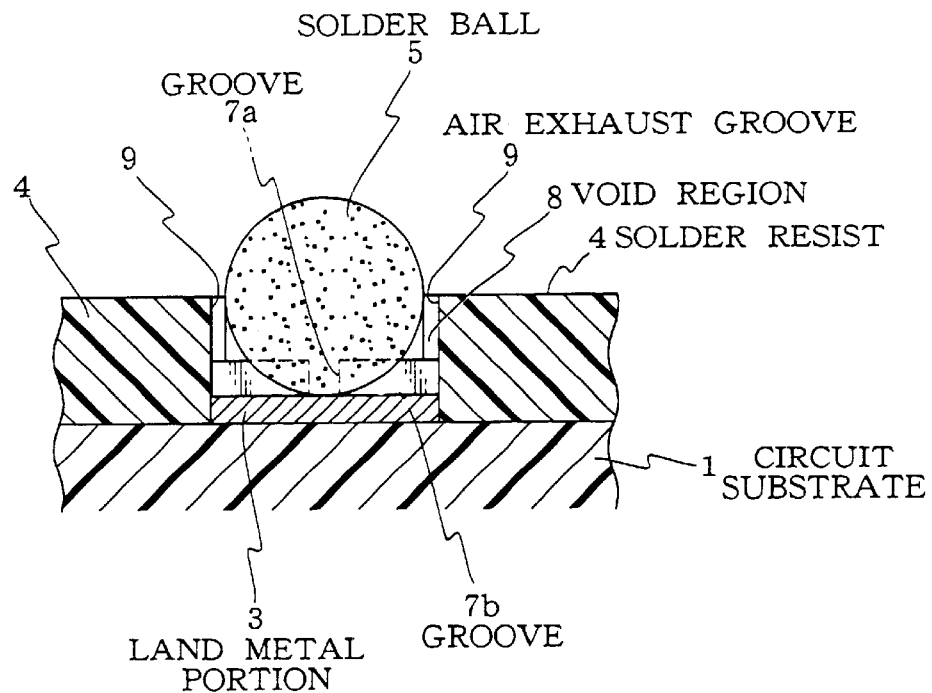
FIG. 1(A) is a cross sectional view of a land metal portion and a solder ball.
Figure 1B:
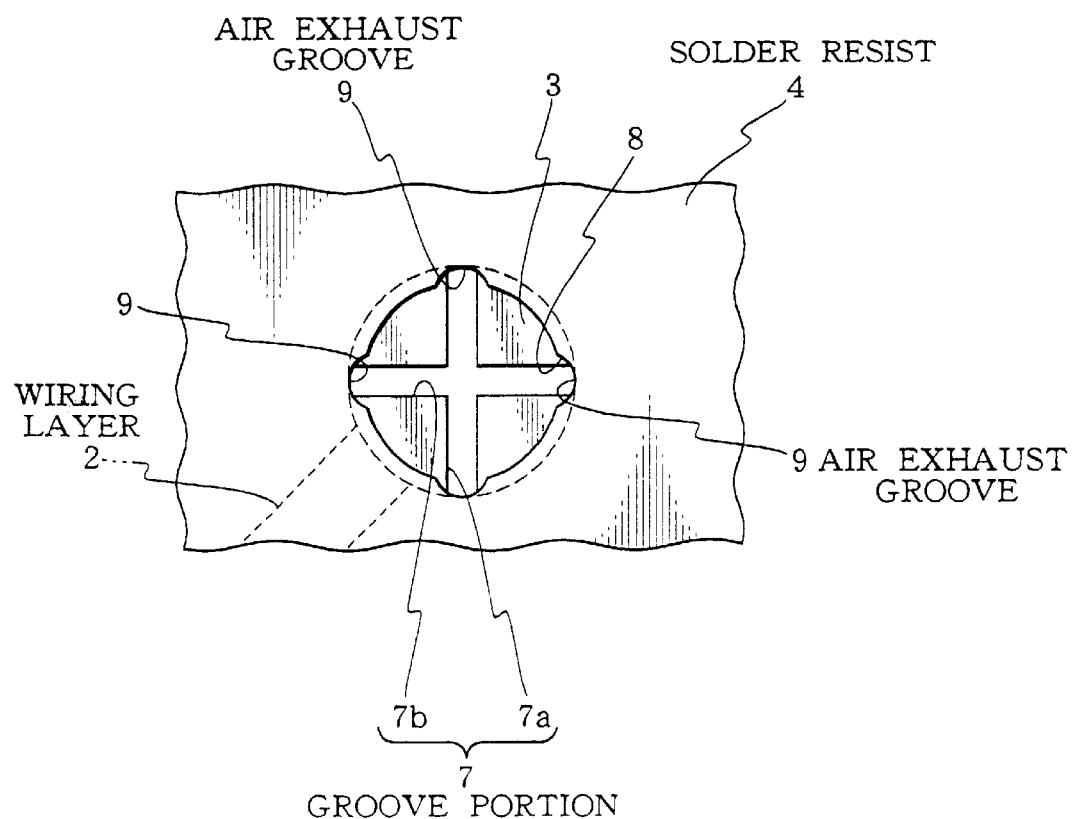
FIG. 1(B) is a plan view of FIG. 1(A) excluding the solder ball.

FIG. 1(A) and FIG. 1(B) show a first embodiment of the present invention.

In FIG. 1(A) and FIG. 1(B), a reference symbol 1 denotes a circuit substrate (also called a "package substrate"). On this circuit substrate 1, a semiconductor element and a wiring layer (IC) 2 are mounted via an insulation layer. A land metal portion 3 is arranged on a part of the wiring layer 2 to constitute a part of a signal I/O terminal.

A reference symbol 4 denotes a solder resist. This solder resist 4 is layered on the circuit substrate 1 so as to cover the land metal portion 3 excluding its central portion and the entire surface of the circuit substrate 1.

In this case, the outer circumference of the land metal portion is surrounded with a pressure by the solder resist 4, which effectively suppresses a peel-off accident of the land metal portion 3 from the circuit substrate (package substrate).

A solder ball 5 is arranged as a part of a signal I/O terminal, as shown in FIG. 1(A), on the central portion of the land metal portion 3 within a region surrounded by the solder resist 4. In this case, the solder ball 5 is arranged on the central portion of the land metal portion 3 in a partially exposed state from the solder resist 4 as shown in the figure. The solder ball 5 is fixed onto the land metal portion 3 with a conductive adhesive or through thermal melting.

A contact surface of the land metal portion 3 with the solder ball 5 is provided with a groove portion 7 extending for continuous communication. In this embodiment, the groove portion 7 consists of a groove 7a and a groove 7b intersecting each other at the center of the land metal portion 3 (the solder ball contact surface) and extending up to the end of the land metal portion 3.

Accordingly, when the solder ball 5 is mounted, firstly, a part of the solder ball 5 is pushed into the center portion of the grooves 7a and 7b and then a portion of the solder ball 5 surrounding that part is uniformly pushed into the four directions extending from the intersection point. This increases the contact area between the solder ball 5 and the land metal portion 3, thereby significantly reducing the electric resistance. This reduces a signal attenuation, enabling to perform the signal transmission smoothly.

Furthermore, even when the solder ball 5 is subjected to an external irregular pressing force in the lateral direction, the solder ball 5 partially inserted into the grooves 7a and 7b has a sufficiently strong mechanical force and can stand the external force.

Moreover, since the contact area is also large and the bonding force through this contact face is also increased, enabling to obtain a semiconductor device having an increased mounting strength.

Moreover, a void region 8 is formed inside the inner circumference of the solder resist covering the end portion of the grooves 7a and 7b (in the vicinity of the contact portion between the end portions of the grooves 7a and 7b with the solder resist 4). An air exhaust groove (drain portion) 9 is formed at the solder resist 4 to provide communication between the void region and the outer atmosphere. This air exhaust groove 9 has a hemispheric cross section and is formed on the inner wall of the solder resist 4 at the side of the land metal portion 3.

This facilitates escape of a remaining portion of flux as an adhesive and a remaining air when the solder ball 5 is mounted. That is, the solder ball 5 is gradually pushed into the center portion and into the grooves 7a and 7b. Even if air is enclosed in the grooves 7a and 7b, the remaining air is pushed through the grooves 7a and 7b into the air exhaust groove 9 and then outside.

Furthermore, since no flux or air is enclosed in the grooves 7a and 7b, it is possible to solve the problem of the prior art that bubbles are enclosed between the land metal portion 3 and the solder ball 5, lowering the mounting strength.

In this embodiment, as shown in FIG. 1(B), the groove portion 7 is realized by two grooves 7a and 7b intersecting each other at the center of the contact surface of the land metal portion 3 with the solder ball 5. However, the groove portion 7 may be realized by two grooves formed in parallel to each other, or three grooves. Furthermore, the groove portion 7 may be a single groove arranged on the solder ball contact surface or arranged to pass through the center portion of the land metal portion 3.

These configurations also can provide almost the same effect as obtained by the embodiment shown in FIG. 1(A) and FIG. 1(B).

Figure 2A:
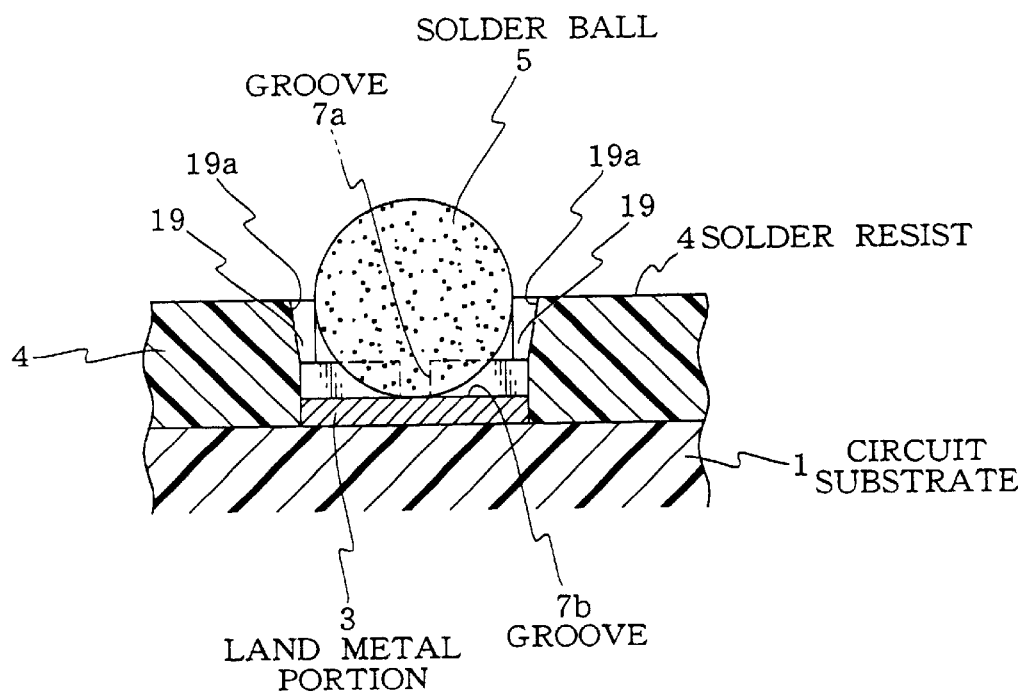
FIG. 2(A) is cross sectional view of a land metal portion and a solder ball.
Figure 2B:
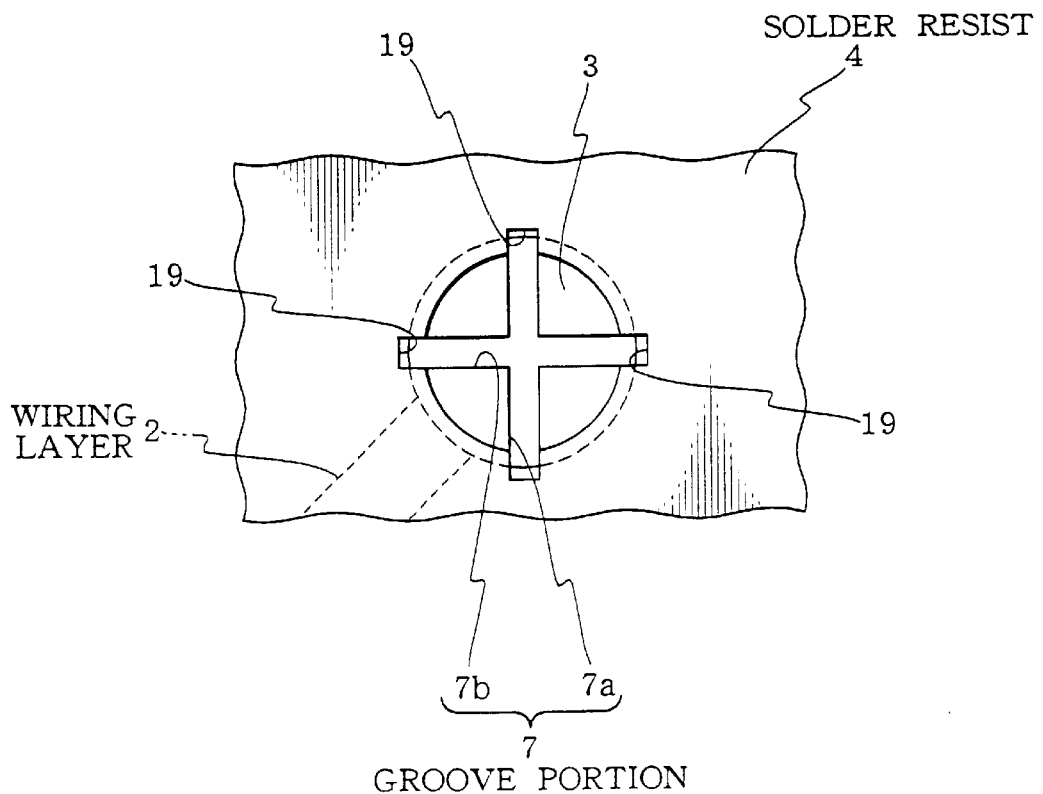
FIG. 2(B) is a plan view of FIG. 2(A) excluding the solder ball.

FIG. 2(A) and FIG. 2(B) show a modified example (1) of the first embodiment.

In this modified example (1), the air exhaust groove 9 is formed as an air exhaust groove 19 having a U-shaped cross section and its bottom is formed as an inclined wall 19a inclined outward.

In this case, the upper end (opening end) of the inclined wall 19a in FIG. 1 is set outside of the diameter of the land metal portion 3.

The other configurations are made identical as in the aforementioned FIG. 1(A) and FIG. 1(B).

This modified example (1) has the same effect as the one shown in FIG. 1(A) and FIG. 1(B). Moreover, even when the solder ball 5 partially protrudes into the air exhaust groove 19 to form an enclosure, since the bottom of the air exhaust groove 19 is inclined outwardly, there is a time lag until a complete enclosure is formed. For this, it is possible to effectively exhaust the remaining air and the like from the grooves 7a and 7b via the air exhaust groove 19.

It should be noted that the inclination of the bottom portion of the air exhaust groove 19 may also be applied to the embodiment of FIG. 1(A) and FIG. 1(B).

Figure 3A:
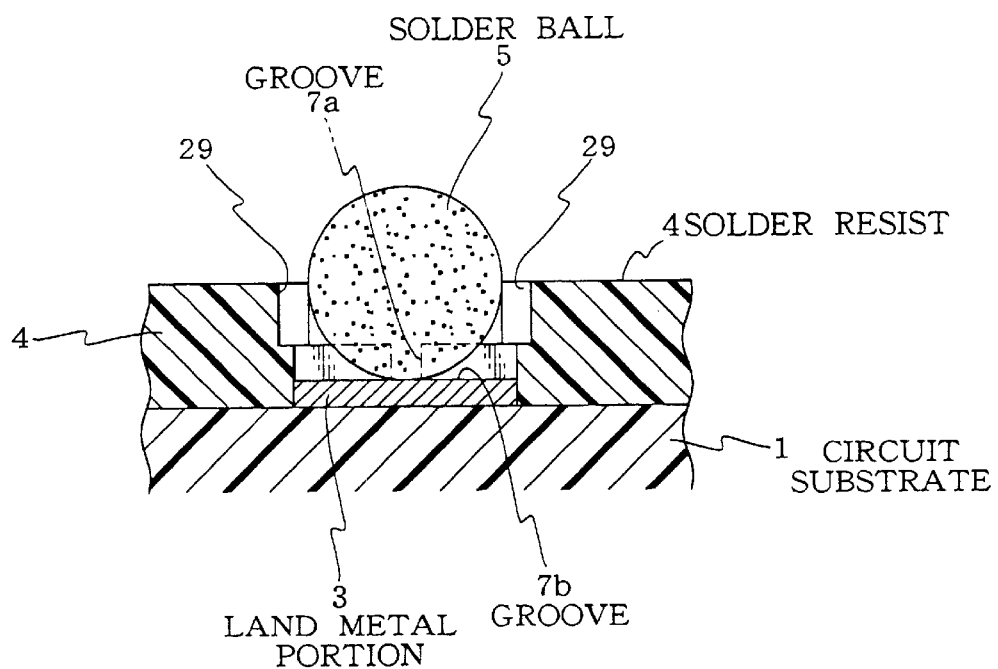
FIG. 3(A) is cross sectional view of a land metal portion and a solder ball.
Figure 3B:
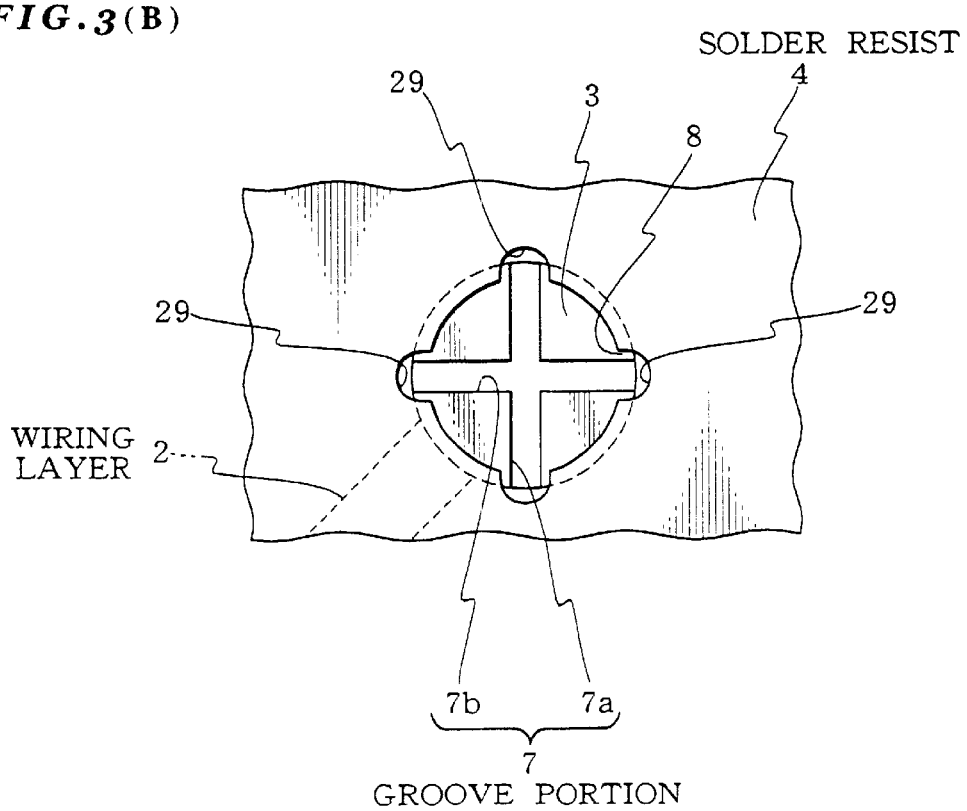
FIG. 3(B) is a plan view of FIG. 3(A) excluding the solder ball.

FIG. 3(A) and FIG. 3(B) show another modified example (2) of the first embodiment.

In this modified example (2), the air exhaust groove 9 disclosed in FIG. 9 is formed as an air exhaust groove 29 having a larger depth as compared to FIG. 1.

That is, the air exhaust groove 29 in this modified example (2) has a hemispheric cross section as in FIG. 1 and has a bottom extending outside the diameter of the land metal portion 3 (deeper than the groove depth of FIG. 1).

This modified example also has the same effect as the example of FIG. 1(A) and FIG. 1(B). Moreover, remaining air and the like enclosed in the grooves 7a and 7b and on the land metal portion 3 can be smoothly exhausted outside through the air exhaust groove 29 having a greater cross sectional area extending outside the land metal portion 3.

Second Embodiment

Figure 4:
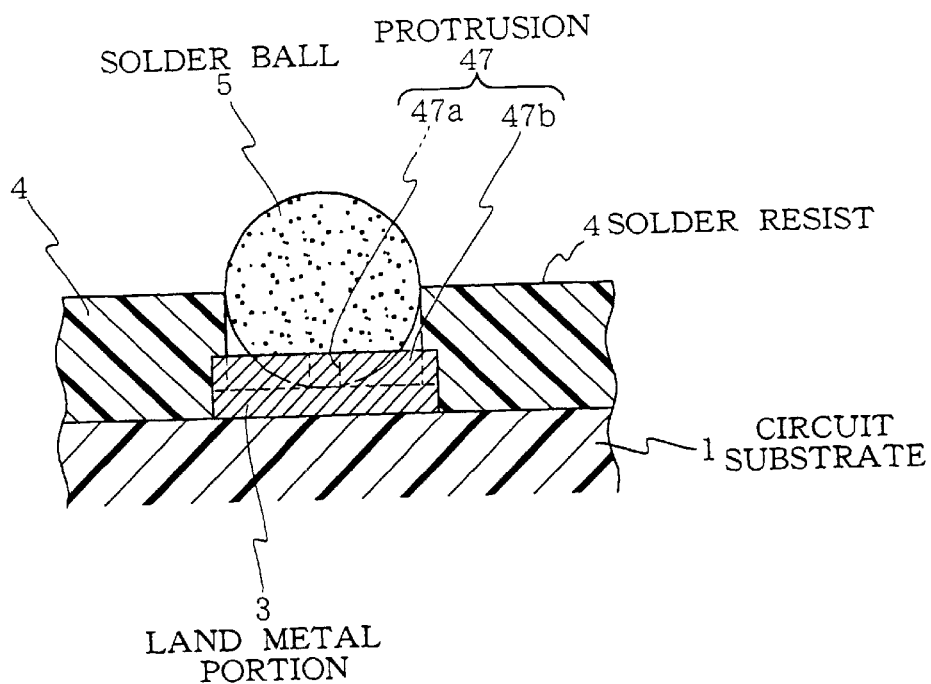
FIG. 4 shows a second embodiment of the present invention.
Figure 4:
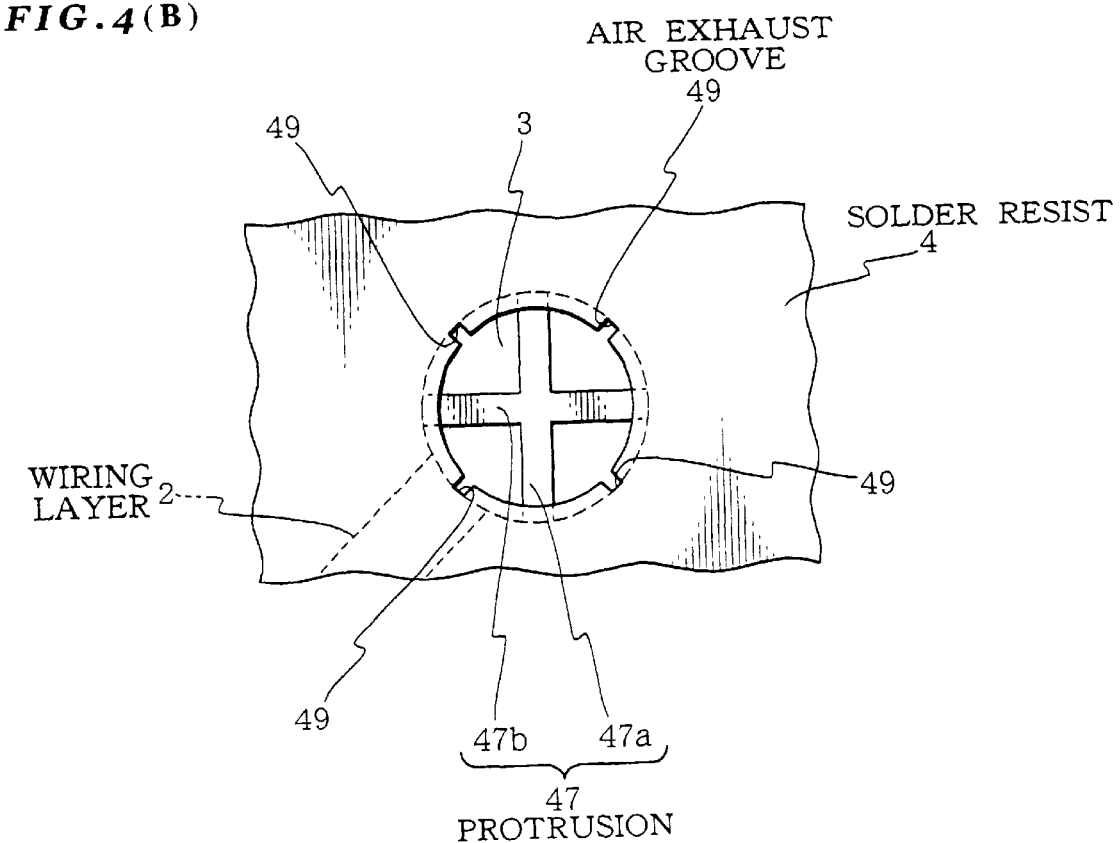
Figure 5A:
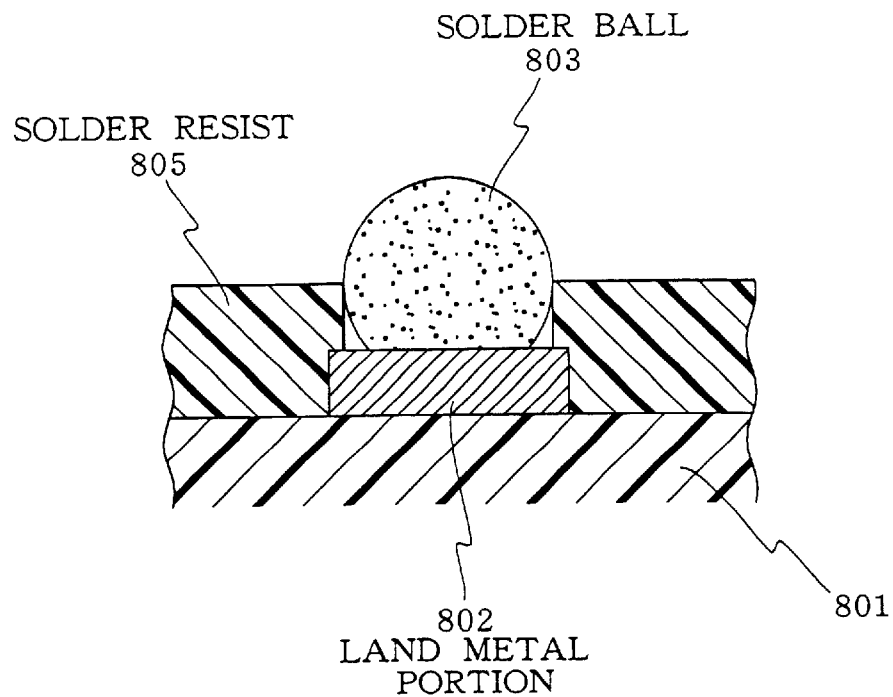
FIG. 5(A) is a cross sectional view of bondage portion between a land metal portion and a solder ball in a semiconductor device of conventional example (1)
Figure 5B:
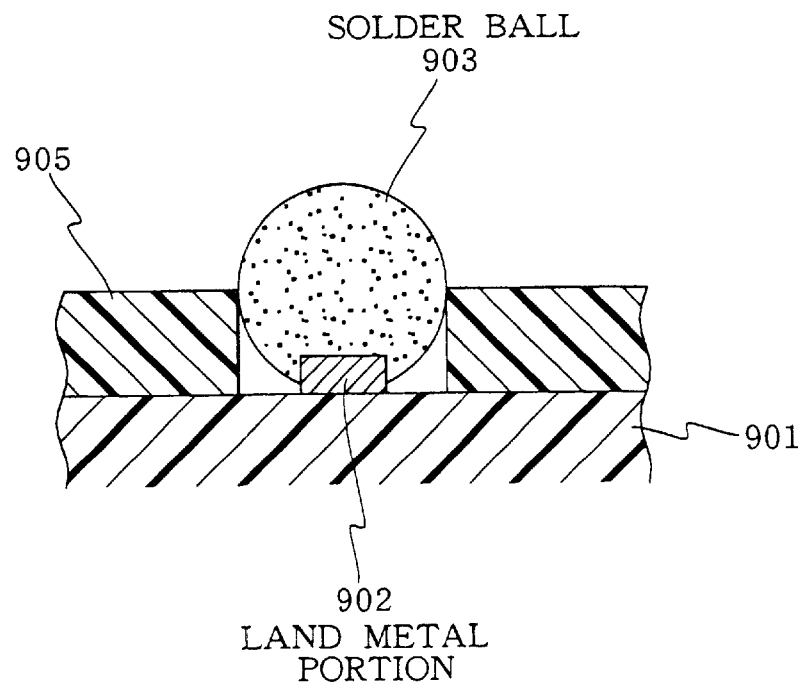
FIG. 5(B) is a cross sectional view of bondage portion between a land metal portion and a solder ball in a semiconductor device of conventional example (2).

FIG. 4(A) and FIG. 4(B) show a second embodiment.

In this second embodiment, the cross-shaped groove portion 7 (grooves 7a and 7b) in the first embodiment is replaced by a cross-shaped protrusion portion 47. Moreover, in this second embodiment, a U-shaped air exhaust groove (drain portion) 49 is arranged on the wall portion of the solder resist 4 at the side of the land metal portion 3 for communicating the circumferential portion with the outside atmosphere.

This will be detailed.

In the second embodiment shown in FIG. 4(A) and FIG. 4(B), a cross-shaped protrusion 47 is arranged on the land metal portion 3 of the first embodiment. This protrusion 47 consists of a protruding line 47a and a protruding line 47b having an identical height and extending up to the end of the land metal portion 3 to form a right angle at the center of the land metal portion 3.

Accordingly, the solder ball 5 is mounted on the land metal portion 3 over the central portion of these protruding lines 47a and 47b. This enables to obtain the same effect as in the case of groove portion 7 in the first embodiment.

For each of the four regions over the land metal portion 3 partitioned by the protruding lines 47a and 47b, the air exhaust groove 49 having the U-shaped cross section is formed on the side wall of the solder resist 4 at the side of the land metal portion. In this embodiment, the air exhaust groove 49 is formed at four positions at an identical interval. That is, this air exhaust groove (drain portion) 49 is provided for each of the regions over the land metal portion 3 partitioned by the protrusion portion 47.

Accordingly, after the solder ball 5 is mounted on the land metal portion 3, the remaining air can smoothly be exhausted outside via the air exhaust groove (drain portion) 49. Even when the air exhaust groove (drain portion) 49 is deformed or arranged with an inclination, the remaining air and the like remaining on the land metal portion 3 can smoothly be exhausted outside through the four air exhaust grooves 49.

The other configuration and effects are almost identical to those of the first embodiment.

In this embodiment, as shown in FIG. 4(B), the protrusion portion 47 is realized as two protruding lines 47a and 47b intersecting each other at the center portion of the solder ball contact surface on the land metal portion 3. However, the protrusion 47 may consists of protruding lines may be arranged in parallel to each other instead of intersecting each other at the center portion. Alternatively, the protrusion 47 may consists of three or more protruding lines. Furthermore, the protrusion 7 may consists of a single protruding line on the solder ball contact surface and the single protruding line may pass through the center of the land metal portion 3.

Moreover, the air exhaust groove (drain portion) 49 having a U-shaped cross section may have a hemispheric cross section and may have a size covering up to outside of the end of the protruding lines. Moreover, in the same way as in the modified example (1), the air exhaust groove 49 may have a bottom as a slanting surface slanting outward as it goes up apart from the land metal portion 3.

Furthermore, instead of providing the air exhaust groove 49 for each of the regions partitioned by the protrusion 47, the air exhaust groove 49 formed in one the adjacent regions. so as to be shared. Moreover, the protrusion 47 may be arranged with an end portion partially cut off.

This also enables to obtain an effect almost equivalent to that of the first embodiment shown in FIG. 1(A) and FIG. 1(B).

According to the present invention having the aforementioned configuration, a solder ball partially protrudes into the groove arranged on the land metal portion or a protruding lines arranged on the land metal portion protrude into the solder ball. This increases the contact area between the land metal portion and the solder ball, thereby significantly increases the bondage strength between the land metal portion and the solder ball as compared in the conventional example.

Moreover, in this invention, since the solder ball partially protrudes into the groove portion on the land metal portion or the protrusion portion on the land metal portion protrudes into the solder ball. This increases the mechanical strength as a whole and effectively opposes to an external oscillation or shock in the lateral direction. Thus, the mounting strength of the solder ball on the land metal portion is significantly increased.

Furthermore, according to the present invention, even when a remaining air or flux are enclosed by a solder ball attached, an air exhaust groove (drain portion) effectively works to exhaust the remaining air and flux outside. This can effectively eliminates the conventional problems (such as generation of air bubbles between the land metal portion and the solder ball and contamination of the solder ball with remaining flux to lower the strength of the solder ball). Thus, the lowering of the bondage strength can be effective prevented. For this, the present invention enables to provide a semiconductor device having a solder ball mounting strength significantly improved.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2000-040576, filed on Feb. 18th, 2000) including specification, claims, drawings and summary are incorporated herein by reference in its entirety.

What is claimed is:

1. A semiconductor device of the BGA configuration comprising:

a circuit substrate;

a wiring layer arranged on the circuit substrate;

a land metal portion formed on a part of the wiring layer;

a solder resist layered so as to cover the land metal excluding a center portion thereof and to cover the entire surface of the circuit substrate excluding the portion of the circuit substrate under the center portion of the land metal;

a solder ball arranged at the center portion of the land metal portion defined and surrounded by the solder resist;

wherein the land metal portion has a solder ball contact surface having at least one groove extending for continuous communication.

2. The semiconductor device as claimed in claim 1, wherein the groove extends passing through the center portion of the solder ball contact surface of the land metal portion.

3. The semiconductor device as claimed in claim 1, wherein the at least one groove comprises at least two grooves arranged at a predetermined interval.

4. The semiconductor device as claimed in claim 1, wherein the at least one groove comprises at least two grooves intersecting each other at the center portion of the solder ball contact surface.

5. The semiconductor device as claimed in claim 1, wherein an air exhaust groove is arranged for each end of the at least one groove in a solder resist portion covering the ends of the at least one groove so that each end of the at least one groove communicates with the external atmosphere.

6. The semiconductor device as claimed in claim 1, wherein a void region is arranged around each end of the at least one groove and an air exhaust groove is formed at the solder resist portion so as to communicate the void region with the external atmosphere.

* * * * *